United States Patent
Sarin et al.

(10) Patent No.: US 8,773,912 B2
(45) Date of Patent: *Jul. 8, 2014

(54) SOFT LANDING FOR DESIRED PROGRAM THRESHOLD VOLTAGE

(75) Inventors: Vishal Sarin, Cupertino, CA (US); Frankie F. Roohparvar, Monte Sereno, CA (US); Jung-Sheng Hoei, Newark, CA (US); Jonathan Pabustan, San Lorenzo, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/547,559

(22) Filed: Jul. 12, 2012

(65) Prior Publication Data

US 2012/0275233 A1 Nov. 1, 2012

Related U.S. Application Data

(63) Continuation of application No. 12/389,048, filed on Feb. 19, 2009, now Pat. No. 8,223,551.

(51) Int. Cl.
*G11C 16/04* (2006.01)
*G11C 11/56* (2006.01)

(52) U.S. Cl.
CPC .... *G11C 11/5621* (2013.01); *G11C 2211/5621* (2013.01); *G11C 11/5628* (2013.01)
USPC ............ 365/185.19; 365/185.18; 365/185.22; 365/185.24; 365/185.03

(58) Field of Classification Search
CPC ........... G11C 11/5621; G11C 11/5628; G11C 2211/5621
USPC ............ 365/185.19, 185.18, 185.22, 185.24, 365/185.03
See application file for complete search history.

(56) References Cited

U.S. PATENT DOCUMENTS

| | | | |
|---|---|---|---|
| 5,295,255 A | 3/1994 | Malecek et al. | |
| 5,555,204 A | 9/1996 | Endoh et al. | |
| 6,011,715 A * | 1/2000 | Pasotti et al. | 365/185.03 |
| 6,169,691 B1 * | 1/2001 | Pasotti et al. | 365/185.25 |
| 6,301,151 B1 | 10/2001 | Engh et al. | |
| 6,343,033 B1 | 1/2002 | Parker | |
| 6,366,496 B1 | 4/2002 | Torelli et al. | |
| 6,392,931 B1 * | 5/2002 | Pasotti et al. | 365/185.19 |
| 6,459,621 B1 | 10/2002 | Kawahara et al. | |
| 6,691,267 B1 | 2/2004 | Nguyen et al. | |
| 6,700,818 B2 | 3/2004 | Shappir et al. | |
| 6,711,061 B2 | 3/2004 | Matsuzaki et al. | |
| 6,714,448 B2 * | 3/2004 | Manea | 365/185.03 |
| 6,788,579 B2 | 9/2004 | Gregori et al. | |
| 6,807,100 B2 | 10/2004 | Tanaka | |
| 6,888,758 B1 * | 5/2005 | Hemink et al. | 365/185.22 |
| 6,894,931 B2 | 5/2005 | Yaegashi et al. | |

(Continued)

FOREIGN PATENT DOCUMENTS

KR 2006-0087447 A 8/2006

*Primary Examiner* — Viet Q Nguyen
(74) *Attorney, Agent, or Firm* — Dicker, Billig & Czaja, PLLC (57) ABSTRACT

Methods of programming memory cells are disclosed. In at least one embodiment, programming is accomplished by applying a first set of programming pulses to program to an initial threshold voltage, and applying a second set of programming pulses to program to a final threshold voltage.

26 Claims, 5 Drawing Sheets

(56) References Cited

U.S. PATENT DOCUMENTS

| | | | |
|---|---|---|---|
| 6,937,518 B1 * | 8/2005 | Park et al. | 365/185.18 |
| 6,996,004 B1 * | 2/2006 | Fastow et al. | 365/185.03 |
| 7,035,146 B2 | 4/2006 | Hemink et al. | |
| 7,079,420 B2 * | 7/2006 | Shappir et al. | 365/185.24 |
| 7,116,581 B2 | 10/2006 | Suzuki et al. | |
| 7,136,304 B2 * | 11/2006 | Cohen et al. | 365/185.19 |
| 7,158,421 B2 | 1/2007 | Li et al. | |
| 7,173,859 B2 | 2/2007 | Hemink | |
| 7,177,199 B2 | 2/2007 | Chen et al. | |
| 7,227,783 B2 * | 6/2007 | Li | 365/185.18 |
| 7,324,383 B2 | 1/2008 | Incarnati et al. | |
| 7,372,754 B2 | 5/2008 | Hwang et al. | |
| 7,397,705 B1 * | 7/2008 | Huang et al. | 365/185.28 |
| 7,400,535 B2 | 7/2008 | Li | |
| 7,433,233 B2 | 10/2008 | Chen et al. | |
| 7,447,068 B2 * | 11/2008 | Tsai et al. | 365/185.03 |
| 7,450,426 B2 | 11/2008 | Li et al. | |
| 7,474,565 B2 | 1/2009 | Huang et al. | |
| 7,492,641 B2 | 2/2009 | Hosono et al. | |
| 7,508,715 B2 | 3/2009 | Lee | |
| 7,539,057 B2 | 5/2009 | Hwang et al. | |
| 7,545,684 B2 | 6/2009 | Nakagawa et al. | |
| 7,548,457 B2 * | 6/2009 | Kang et al. | 365/185.03 |
| 7,551,483 B2 | 6/2009 | Cernea | |
| 7,558,120 B2 * | 7/2009 | Takai | 365/185.22 |
| 7,596,031 B2 | 9/2009 | Hemink et al. | |
| 7,602,650 B2 | 10/2009 | Jung et al. | |
| 7,656,709 B2 | 2/2010 | Goda et al. | |
| 7,656,710 B1 | 2/2010 | Wong | |
| 7,663,925 B2 | 2/2010 | Yu et al. | |
| 7,675,722 B2 | 3/2010 | Choi | |
| 7,675,782 B2 | 3/2010 | Cohen et al. | |
| 7,688,638 B2 | 3/2010 | Hemink | |
| 7,796,435 B2 | 9/2010 | Cernea | |
| 7,800,856 B1 | 9/2010 | Bennett et al. | |
| 7,800,956 B2 * | 9/2010 | Lee et al. | 365/185.22 |
| 7,821,840 B2 * | 10/2010 | Hadas et al. | 365/185.28 |
| 7,881,110 B2 | 2/2011 | Park | |
| 8,223,551 B2 * | 7/2012 | Sarin et al. | 365/185.19 |
| 2008/0310224 A1 | 12/2008 | Roohparvar et al. | |
| 2009/0129146 A1 | 5/2009 | Sarin et al. | |

* cited by examiner

SOFT LANDING FOR DESIRED PROGRAM THRESHOLD VOLTAGE

RELATED APPLICATION

This application is a Continuation of U.S. application Ser. No. 12/389,048, titled "SOFT LANDING FOR DESIRED PROGRAM THRESHOLD VOLTAGE," filed Feb. 19, 2009 and issued as U.S. Pat. No. 8,223,551 on Jul. 17, 2012, which is commonly assigned and incorporated herein by reference.

FIELD

The present disclosure relates generally to semiconductor memories, and in particular the present disclosure relates to programming in memories.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage nodes, such as floating gates or trapping layers or other physical phenomena, determine the data state of each cell. Common uses for flash memory include personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a logical column of memory cells are coupled in parallel with each memory cell coupled to a bit line. In NAND flash architecture, a column of memory cells are coupled in series with only the first memory cell of the column coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Multilevel cells can take advantage of the analog nature of a traditional flash cell by assigning a bit pattern to a specific threshold voltage (Vt) range stored on the cell. This technology permits the storage of two or more bits per cell, depending on the quantity of voltage ranges assigned to the cell and the stability of the assigned voltage ranges during the lifetime operation of the memory cell.

For example, a cell may be assigned four different voltage ranges of 200 mV for each range. Typically, a dead space of 0.2V to 0.4V is between each range to keep the ranges from overlapping. If the voltage stored on the cell is within the first range, the cell is storing a logical 11 state and is typically considered the erased state of the cell. If the voltage is within the second range, the cell is storing a logical 01 state. This continues for as many ranges that are used for the cell provided these voltage ranges remain stable during the lifetime operation of the memory cell.

Since two or more states are stored in each MLC, the width of each of the voltage ranges for each state is very important. The width is related to many variables in the operation of a memory circuit. For example, a cell could be verified at one temperature and read at a different temperature. The circuitry that determines if the cell is erased or programmed to the correct Vt range has to make that determination. That circuitry has some of its characteristics influenced by temperature. A Vt window is a sum of all of these types of differences, translating into a shift in the perceived window of the Vt. In order for the window to operate, the width of the four states plus a margin between each state should amount to the available window.

Figure 7:
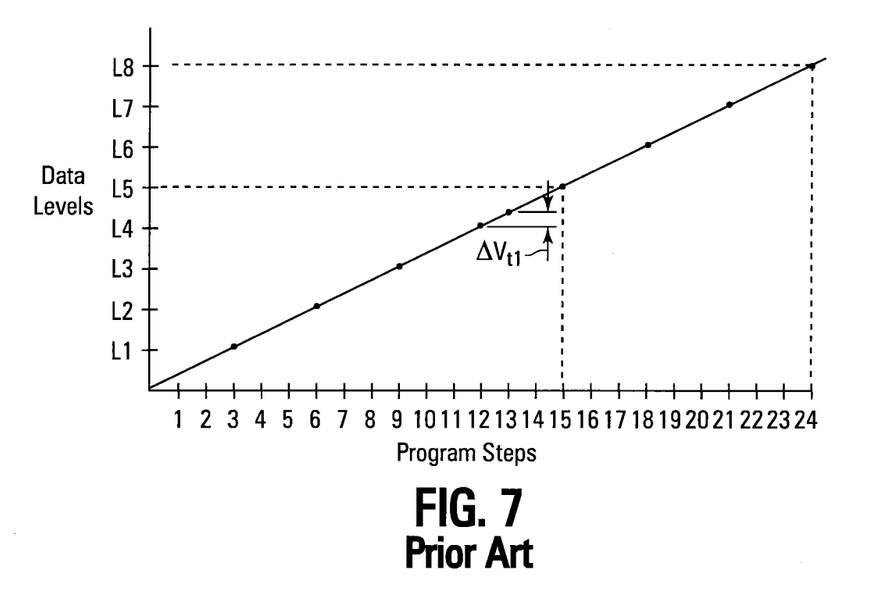
FIG. 7 is a diagram showing a prior art series of programming pulses.
Figure 8:
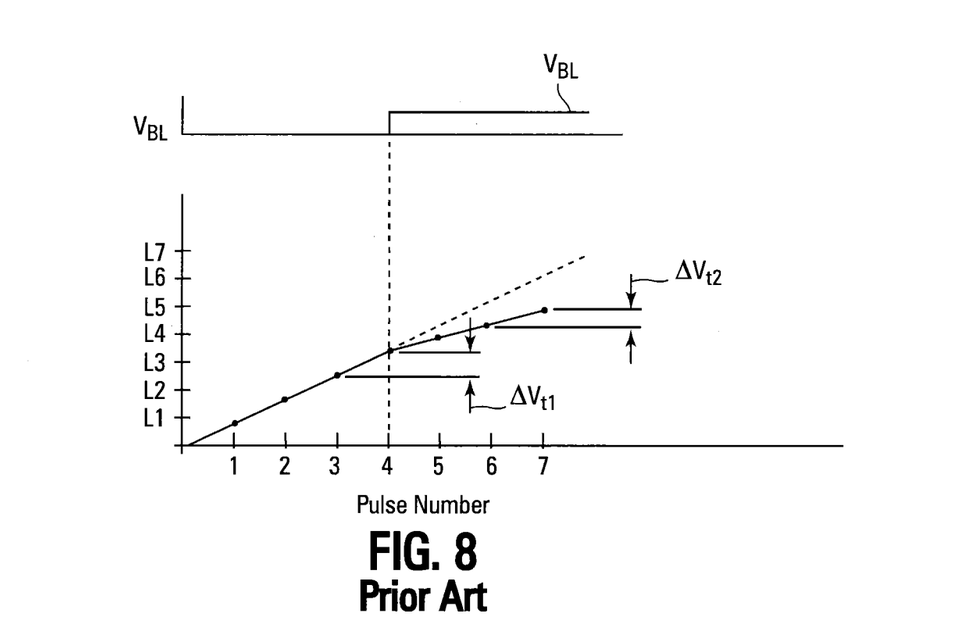
FIG. 8 is a diagram showing another prior art series of programming pulses.

FIGS. 7 and 8 show representative prior art programming pulses for programming cells. FIG. 7 shows a traditional set of small increment programming pulses, having approximately 24 pulses each causing approximately a $\Delta Vt1$ shift in cell Vt for each pulse. To program to data level 5, approximately 15 pulses are used. To program to data level 8, approximately 24 pulses are used.

In FIG. 8, an alternate prior art set of programming pulses for programming to data level 5 are shown, with the initial four pulses causing approximately a $\Delta Vt2$ shift>$\Delta Vt1$ in cell Vt. After pulse four, when the cell Vt has approached near to data level 5, but not yet reached data level 5, a bias is applied to the data line (such as those commonly referred to as bit lines) coupled to the cell to decrease the amount of Vt shift, temporarily, to approximately $\Delta Vt2$.

Another method of programming, to reduce cell disturb in memories is shown in U.S. application Ser. No. 12/274,727, entitled Two-Part Programming Methods and Memories, and which is commonly assigned to the owner of the present application.

For the reasons stated above, and for other reasons stated below which will become apparent to those skilled in the art upon reading and understanding the present specification, there is a need in the art for fast programming of multilevel cells with increased program resolution.

DETAILED DESCRIPTION

In the following detailed description of the embodiments, reference is made to the accompanying drawings that form a part hereof. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present disclosure is defined only by the appended claims, along with the full scope of equivalents to which such claims are entitled.

The various method embodiments described herein include methods for programming selected cells in a memory using two sets of programming pulses with large program steps, for example, to reduce programming time while maintaining programming resolution.

Multilevel cells (MLC) are programmed with a set of programming pulses that increase at each successive pulse by an increment, resulting in the programming of the cell to a specific level. The increment is referred to herein as $\Delta V pgm$.

Figure 1:
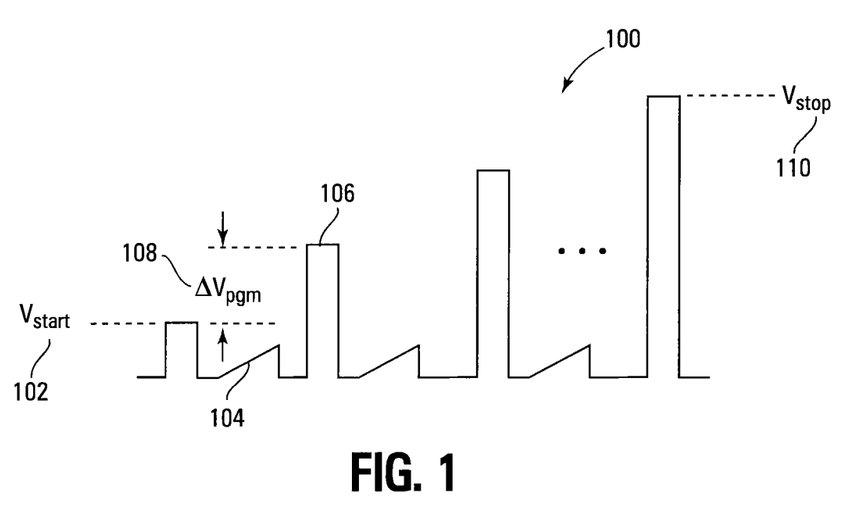
FIG. 1 is a diagram showing a series of programming pulses for a memory according to one embodiment.
Figure 2:
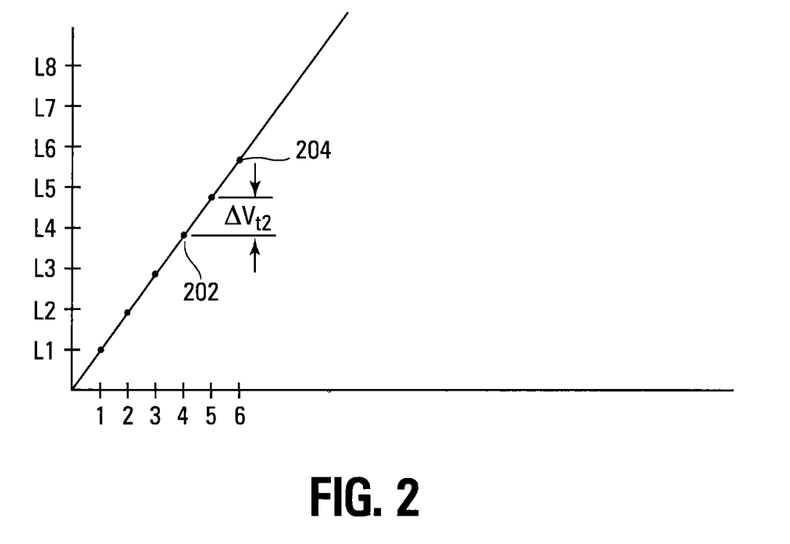
FIG. 2 is a chart of threshold voltages during programming according to one embodiment.

An embodiment of a method 100 of programming a memory is shown in greater detail in FIGS. 1, 2, 3, and 4. In the method, at least two series of programming pulses (FIGS. 2 and 3 or FIGS. 2 and 4) are used to program selected cells of the memory, such as cells accessed by a particular access line or access lines, also referred to as word lines. The first series of pulses starts with a program pulse at a start voltage Vstart 102, as shown in FIG. 1. Following a verify pulse 104, a second program pulse 106 is applied to the selected cells, at a higher voltage of Vstart plus a program voltage step $\Delta V pgm$ 108 (sometimes referred to as a program voltage gap). The programming pulses are increased progressively by $\Delta V pgm$ for each successive program pulse until a programming pulse of Vstop 110 is reached. The total range of programming pulse voltages therefore ranges from Vstart 102 to Vstop 110. Referring now to FIG. 2, each pulse raises the threshold voltage of the cells by an amount indicated as $\Delta Vt2$. These steps are larger than the steps $\Delta Vt1$ (FIG. 7) obtained by using a traditional set of programming pulses with a smaller $\Delta V pgm$. A first series of program pulses and their result on the threshold voltage of the cells being programmed is shown in FIG. 2. In FIG. 2, the result of a series of four program pulses is shown to raise the threshold voltage of the cell being programmed to initial Vt 202. In FIG. 2, the result of a series of six program pulses is shown to raise the threshold voltage of the cell being programmed to initial Vt 204. The number of pulses in a complete program sequence is (Vstop−Vstart)/$\Delta V pgm$, however not all of the program pulses will necessarily be used to program the cells. In one embodiment, the difference between Vstart 102 and Vstop 110 is 10 volts, and $\Delta V pgm$ is 400 mV. This results in 25 pulses for a full series of program pulses.

Figure 3:
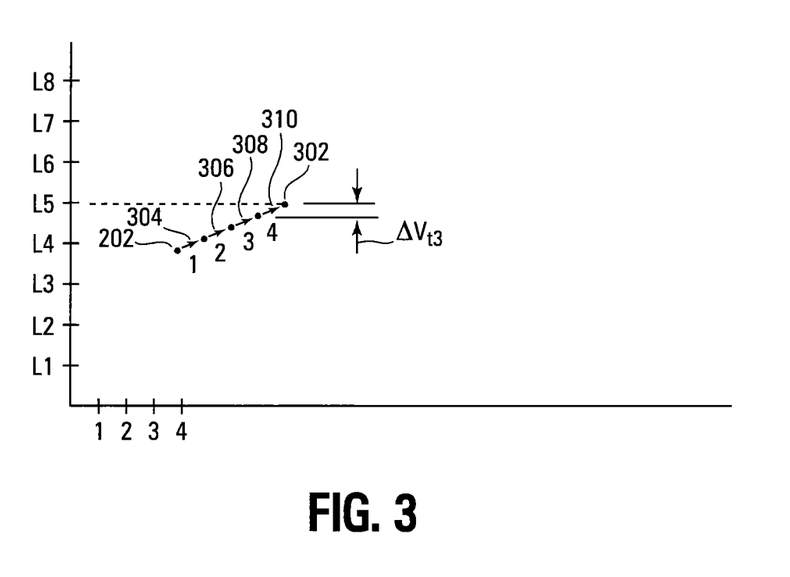
FIG. 3 is a chart of threshold voltages during programming according to another embodiment.

In programming, successive programming pulses are applied until the selected cells are programmed to a threshold voltage approximately equal to an initial threshold voltage (Vt initial 112). This initial Vt is in one embodiment a voltage less than a final desired threshold voltage (Vt final 114) for the cells to be programmed, but close to the final desired threshold voltage. With reference to the programming of cells that are to be programmed to level 5, once the initial Vt 202 is reached, or the Vt of the cells being programmed is close to the desired initial Vt, the cell is inhibited from further programming In this instance, that occurs after four programming pulses. After the programming sequence is finished for all cells, to program the cell Vt to its final value (data level 5), a second series of programming pulses as shown in FIG. 3 is applied to program the cells to the final desired threshold voltage 302. This second set of programming pulses programs the cells in Vt increments of approximately $\Delta Vt3$, which is in one embodiment approximately the same as $\Delta Vt1$ of FIG. 7. As shown in FIG. 3, on the first pulse of the second set of pulses, the programmed cell Vt moves a small increment of approximately $\Delta Vt$ 3 as indicated by arrow 304. The threshold voltage Vt moves even with pulses with lower program voltage compared the program voltage pulse at which the cell was inhibited. Each successive pulse 306, 308, and 310 moves the Vt by an increment of approximately $\Delta Vt3$ until after four pulses, the cell Vt has moved from its initial Vt level 202 to its final Vt level 302. For the programming sequence, approximately eight pulses are used to program to level 5, when the prior art used approximately 15 pulses. Further, the accuracy of the programming is not affected.

Figure 4:
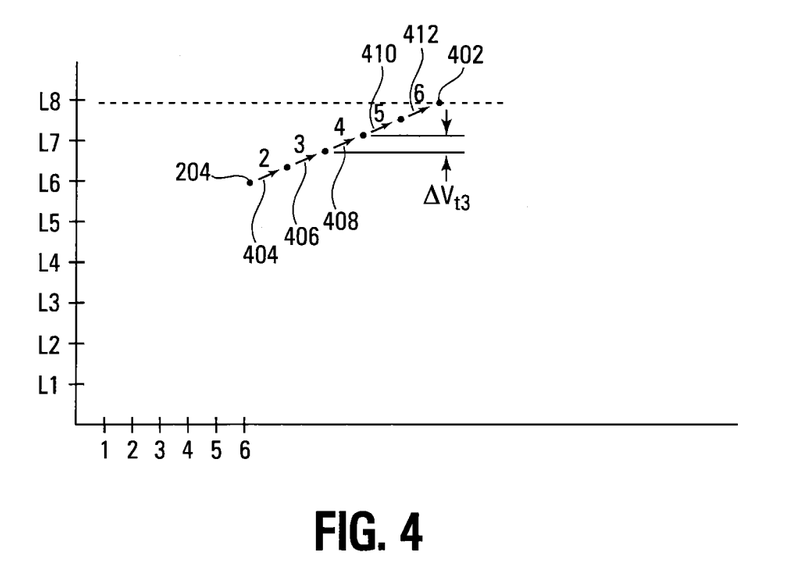
FIG. 4 is a chart of threshold voltages during programming according to another embodiment.

With reference to the programming of cells that are to be programmed to level 8, once the initial Vt 204 of between level 6 and level 7 is reached, or the Vt of the cells being programmed is close to the desired initial Vt, the cell is inhibited from further programming. In this instance, that occurs after six programming pulses. After the programming sequence is finished for all cells, to program the cell Vt to its final value (data level 8), a second series of programming pulses as shown in FIG. 4 is applied to program the cells to the final desired threshold voltage 402. This second set of programming pulses programs the cells in Vt increments of approximately $\Delta Vt3$, which is in one embodiment approximately the same as $\Delta Vt1$ of FIG. 7. As shown in FIG. 4, on the first pulse of the second set of pulses, the programmed cell Vt does not move at all. This is, in part, because when the initial Vt 204 is sufficiently high, the first pulse or two is not sufficient to raise the Vt. On the second pulse of the second set of pulses, the programmed cell Vt moves a small increment of approximately $\Delta Vt$ 3 as indicated by arrow 404. The threshold voltage Vt moves even though it does not directly correspond to a pulse, that is it is not lined up with the pulse. Each successive pulse 406, 408, 410, and 412 moves the Vt by an increment of approximately $\Delta Vt3$ until after six pulses, the cell Vt has moved from its initial Vt level 204 to its final Vt level 402. For the programming sequence, approximately twelve pulses are used to program to level 8, when the prior art used approximately 24 pulses. Further, the accuracy of the programming is not affected. In at least one embodiment, the voltage steps are substantially equal to one another.

In one embodiment, the second series of pulses starts with a program pulse at a start voltage Vstart 102, as shown in FIG. 1. Following a verify pulse 104, a second program pulse 106 is applied to the selected cells, at a higher voltage of Vstart plus a step $\Delta V pgm$ 108. The programming pulses are increased progressively by $\Delta V pgm$ for each successive program pulse until a programming pulse of Vstop 110 is reached. The total range of programming pulse voltages therefore ranges from Vstart 102 to Vstop 110. Each pulse raises the threshold voltage of the cells by an amount indicated as $\Delta Vt3$ as shown in FIG. 3 or FIG. 4. These steps are smaller than the steps obtained in the first series of programming pulses, and allow for a soft landing of the cell threshold voltage to the final Vt 114. The second series of program pulses and their result on the threshold voltage of the cells being programmed is shown in FIG. 3 or FIG. 4. In FIG. 3, the result of a series of four program pulses is shown to raise the threshold voltage of the cells being programmed to from approximately the initial Vt 202 to the final Vt 302. In FIG. 4, the result of a series of six program pulses is shown to raise the threshold voltage of the cells being programmed to from approximately the initial Vt 204 to the final Vt 402. The number of pulses in a complete program sequence is (Vstop−

Vstart)/ΔVpgm, however not all of the program pulses will necessarily be used to program the cells. In one embodiment, the difference between Vstart 102 and Vstop 110 is 10 volts, and ΔVpgm is 400 mV. This results in 25 pulses for a full series of program pulses.

It should be understood that the levels of Vstart 102, Vstop 110, and ΔVpgm 108 for the second series of programming pulses may be the same as or different from the levels of Vstart 102, Vstop 100, and ΔVpgm 108 for the first series of programming pulses. For example, in one embodiment, the second set of programming pulses starts with a program pulse at Vstart which is the same as the initial Vstart, and the series of program pulses increments by ΔVpgm just as in the first series of programming pulses. The repetition of pulses with steps of ΔVpgm increases the threshold voltage programmed to the cells being programmed by less than the initial pulses, providing a soft landing ramp to a final threshold voltage 114 for the programming.

In another embodiment, the second set of programming pulses begins at a Vstart value higher than the Vstart value for the first series of programming pulses, uses the same ΔVpgm, and finishes at a second Vstop value higher than or lower than the initial Vstop, depending upon the range of Vstop–Vstart. The resolution of programming to a final threshold voltage is maintained without the requirement for very small program steps, while the time required for programming is reduced.

Specifically, in order to provide the resolution required to program to a specific threshold voltage with a single set of program pulses as is known, the ΔVpgm for programming pulses must be much lower than those of the present embodiments. For example, with a difference from Vstop to Vstart of 10 volts, using a single set of program pulses, ΔVpgm must be about 50 mV. This equates to 200 programming pulses. Each program pulse takes approximately 10 microseconds (μs), leading to a programming time of 2 milliseconds (ms). In contrast, the ΔVpgm of the embodiments of the present disclosure using two series of programming pulses can be on the order of 400 mV. For the same 10 voltage range of Vstop-Vstart, the first series of program pulses will have 25 pulses at 10 μs, and the second series of program pulses will have 25 pulses at 10 for a total programming time of 0.5 ms. Further, even reducing the ΔVpgm for the second series of pulses, for example to 200 mV instead of 400 mV, the total program time is 25 pulses at 10 is for the first series of program pulses, and 50 pulses at 10 μs for the second series of program pulses, for a total program time of 0.75 ms. The large ΔVpgm does not reduce programming resolution, and decreases programming time.

In another embodiment, the difference between Vstop and Vstart for the second series of program pulses can be smaller than 10 volts. In still another embodiment, the Vstart level for the first series of pulses can be different than the Vstart level for the second series of program pulses. For example, Vstart for the second series of program pulses can be higher than the Vstart level for the first series of program pulses.

The large ΔVpgm for the embodiments of the present disclosure allows for large changes in the programmed voltage level (ΔVtstep1) of the cells that are being programmed during the first series of programming pulses, and for smaller more delicate changes in the programmed voltage level (ΔVtstep2) of the cells that are being programmed during the second series of programming pulses, while still using large ΔVpgm increments for faster programming.

In another embodiment, memory cells are programmed using a first series of programming pulses that begin with a programming pulse at a first programming start voltage. The first programming start voltage is incremented by a particular percentage of a first range of programming pulse voltages (for example a range from the first programming start voltage to a first programming stop voltage), and successive pulses each increased by the particular percentage are used for programming until an initial threshold voltage for the cells being programmed, as described above, is reached. Once the initial threshold voltage is reached, a second series of programming pulses is initiated, beginning with a programming pulse at a second programming start voltage. The second programming start voltage in one embodiment is higher than the first programming start voltage. The second programming start voltage is incremented by a particular percentage of a second range of programming pulse voltages (for example a range from the second programming start voltage to a second programming stop voltage), and successive pulses each increased by the same particular percentage of the second range, even if the second range is smaller than the first voltage range, are applied until the final desired threshold voltage for the cells being programmed, as described above, is reached.

For example, in FIG. 2, pulse number 1 is at a voltage Vstart1, and pulse number 6 is at a voltage Vstop1. Pulse number 6 is not reached for programming for all levels. In FIG. 3 pulse number 1 is at a voltage Vstart2, and pulse number 6 (although not reached in FIG. 3 since programming is completed to level 5 after four pulses of the second set of pulses) is at a voltage Vstop2. In various embodiments, the relationship between start and stop voltages can be as follows. Vstart2 can be ≥Vstart1, and Vstop2 can be <Vstop1 or can be >Vstop1 in pulse magnitude, depending upon characterizing the particular part and what series of programming pulses works for the part.

Figure 5:
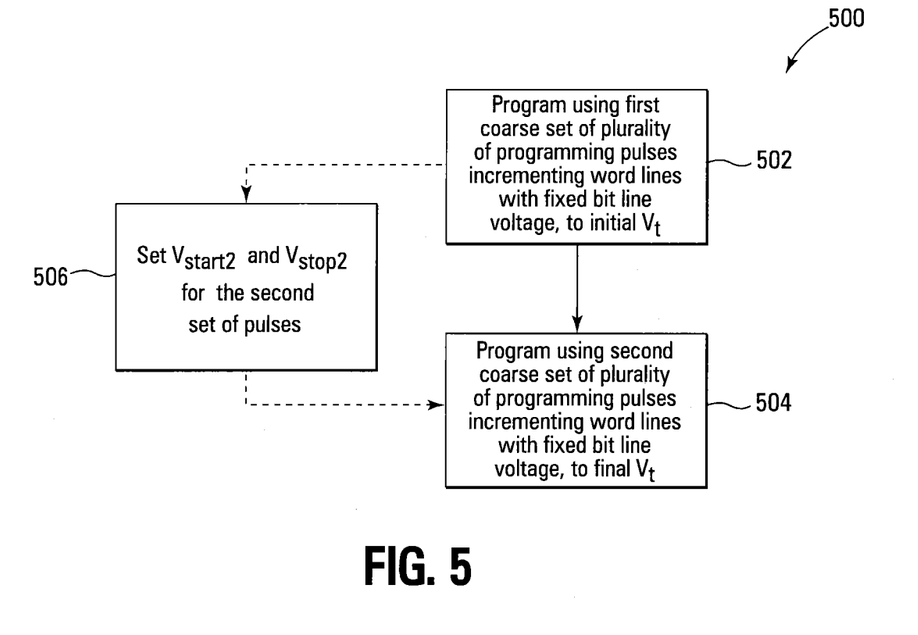
FIG. 5 is a flow chart diagram of a method according to another embodiment.

FIG. 5 is a flow chart diagram of a method 500 according to one embodiment. Method 500 comprises programming selected cells of a memory using a first coarse set of a plurality of programming pulses, incrementing word lines with a fixed bit line voltage, to raise the threshold voltage of the selected cells to approximately an initial threshold voltage in block 502, and programming the selected cells to a final threshold voltage using a second set of a plurality of programming pulses, incrementing word lines with fixed bit line voltage, in block 504. Optionally, in block 506, Vstart2 and Vstop2 are set as discussed above for the second set of a plurality of programming pulses.

It should further be understood that while two series of programming pulses are shown and described herein, the embodiments are not limited to using two sets of programming pulses, and a larger number of sets of programming pulses may be applied without departing form the scope of the disclosure.

For the embodiments described herein, the programming methods allow for the use of large program pulse steps (ΔVpgm) instead of small program pulse steps. Since each programming pulse requires time to complete, fewer program pulses means faster programming. The various embodiments described herein reduce the number of program pulses used for programming, but maintain programming resolution.

The programming methods described herein are in another embodiment further controlled by controlling the pulse width for the programming pulses of the first set of pulses used in initial programming to raise the threshold voltage of the selected cells to approximately an initial threshold voltage. The pulse widths are maintained sufficiently narrow so that the cells being programmed do not saturate, that is, the cells being programmed do not have their threshold voltages raised as high as they can be raised for the particular programming voltage. If this occurs, the cells saturate, and later programming pulses in the second set of pulses that are below the maximum voltage of the first set of programming pulses will have no effect on the threshold voltage of the cells being programmed. This will substantially reduce or even eliminate the soft landing of the cells being programmed to their final threshold voltage. However, as long as the programming pulse width for the first set of programming pulses does not allow the cells being programmed to saturate, the methods will remain effective.

Further, the various methods described herein may program all of the levels as part of one sequence of programming pulses, i.e., one programming operation. That is, the selected cells may all be programmed at one time to each of the various levels, instead of individual levels being programmed.

Figure 6:
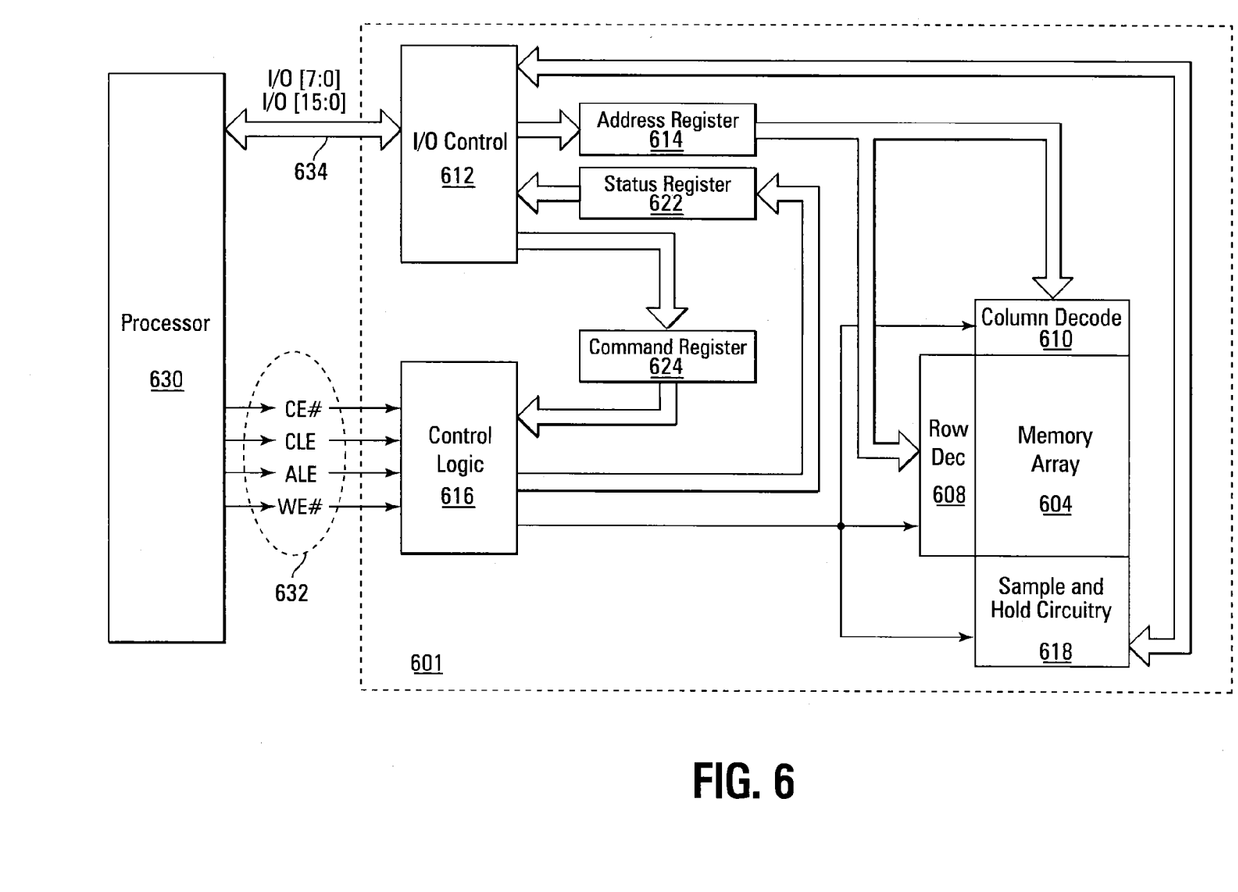
FIG. 6 is a functional block diagram of an electrical system having at least one memory device with a memory array configuration according to one embodiment of the present invention.

FIG. 6 is a simplified block diagram of a memory device 601 according to an embodiment of the disclosure, and on which various embodiments of the disclosure are practiced. Memory device 601 includes an array of memory cells 604 logically arranged in rows and columns. Although the various embodiments will be described primarily with reference to NAND memory arrays, the various embodiments are not limited to a specific architecture of the memory array 604. Some examples of other array architectures suitable for the present, embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 608 and a column decode circuitry 610 are provided to decode address signals provided to the memory device 601. Address signals are received and decoded to access memory array 604. Memory device 601 also includes input/output (I/O) control circuitry 612 to manage input of commands, addresses and data to the memory device 601 as well as output of data and status information from the memory device 601. An address register 614 is coupled between I/O control circuitry 612 and row decode circuitry 608 and column decode circuitry 610 to latch the address signals prior to decoding. A command register 624 is coupled between I/O control circuitry 612 and control logic 616 to latch incoming commands. Control logic 616 controls access to the memory array 604 in response to the commands and generates status information for the external processor 630. The control logic 616 is coupled to row decode circuitry 608 and column decode circuitry 610 to control the row decode circuitry 608 and column decode circuitry 610 in response to the addresses.

Control logic 616 is also coupled to a sample and hold circuitry 618. The sample and hold circuitry 618 latches data, either incoming or outgoing, in the form of analog voltage signals. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 618 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog signal using a differential amplifier having a grounded input or other reference signal as a second input. The output of the differential amplifier could then be passed to the I/O control circuitry 612 for output from the memory device, in the case of a read operation, or used for comparison during one or more verify operations in programming the memory device. It is noted that the I/O control circuitry 612 could optionally include analog-to-digital conversion functionality and digital-to-analog conversion (DAC) functionality to convert read data from an analog signal to a digital bit pattern and to convert write data from a digital bit pattern to an analog signal such that the memory device 601 could be adapted for communication with either an analog or digital data interface.

During a write operation, target memory cells of the memory array 604 are programmed, for example using two sets of programming pulses as described above, until voltages indicative of their Vt levels match the levels held in the sample and hold circuitry 618. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the Vt levels of the target memory cells are passed to the sample and hold circuitry 618 for transfer to an external processor (not shown in FIG. 6) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 618 may include caching, i.e., multiple storage locations for each data value, such that the memory device 601 may be reading a next data value while passing a first data value to the external processor, or receiving a next data value while writing a first data value to the memory array 604. A status register 622 is coupled between I/O control circuitry 612 and control logic 616 to latch the status information for output to the external processor.

Memory device 601 receives control signals at control logic 616 over a control link 632. The control signals may include a chip enable CE#, a command latch enable CLE, an address latch enable ALE, and a write enable WE#. Memory device 601 may receive commands (in the form of command signals), addresses (in the form of address signals), and data (in the form of data signals) from an external processor over a multiplexed input/output (I/O) bus 634 and output data to the external processor over I/O bus 634.

In a specific example, commands are received over input/output (I/O) pins [7:0] of I/O bus 634 at I/O control circuitry 612 and are written into command register 624. The addresses are received over input/output (I/O) pins [7:0] of bus 634 at I/O control circuitry 612 and are written into address register 614. The data may be received over input/output (I/O) pins [7:0] for a device capable of receiving eight parallel signals, or input/output (I/O) pins [15:0] for a device capable of receiving sixteen parallel signals, at I/O control circuitry 612 and are transferred to sample and hold circuitry 618. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 6 has been simplified to help focus on the embodiments of the disclosure.

A program function on selected cells, blocks, pages, or the like of the memory 600 is performed as described above with respect to FIGS. 1-3, using two sets of programming pulses.

Additionally, while the memory device of FIG. 6 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 634. Because the data signals represent bit patterns instead of individual bits, serial communication of an 8-bit data signal could be as efficient as parallel communication of eight signals representing individual bits.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface.

CONCLUSION

Methods and memories have been described that include using two sets of programming pulses with large steps to provide a faster programming time with programming resolution maintained.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of programming a memory, comprising:
   raising a threshold voltage of each of a plurality of selected cells of the memory from an initial threshold voltage to an intermediate threshold voltage for the cell of the plurality of selected cells using a first plurality of programming pulses;
   inhibiting cells of the plurality of selected cells from further programming by the first plurality of programming pulses after their intermediate threshold voltage is reached; and
   raising the threshold voltage of each of the selected cells of the plurality of selected cells from its respective intermediate threshold voltage to a final threshold voltage for the respective cell using a second plurality of programming pulses.

2. The method of claim 1, wherein the first plurality of programming pulses raises the threshold voltage of each of the plurality of selected cells by a first increment, and the second plurality of programming pulses raises the threshold voltage of each of the plurality of selected cells by a second increment smaller than the first increment.

3. The method of claim 1, wherein the intermediate threshold voltage is a particular percentage below the final threshold voltage.

4. The method of claim 1, wherein the first plurality of programming pulses starts at a start voltage and stops at a stop voltage, and wherein the second plurality of programming pulses starts at the start voltage and stops at the stop voltage.

5. The method of claim 1, wherein using a first plurality of programming pulses further comprises applying a verify pulse after each programming pulse.

6. A method of programming a memory, comprising:
   raising a threshold voltage of each of a plurality of selected cells of the memory from an initial threshold voltage to an intermediate threshold voltage for the cell of the plurality of selected cells using a first plurality of programming pulses; and
   raising the threshold voltage of each of the selected cells of the memory from its respective intermediate threshold voltage to a final threshold voltage for the respective cell using a second plurality of programming pulses;
   wherein using a second plurality of programming pulses further comprises applying a verify pulse after each programming pulse of the second plurality of programming pulses.

7. The method of claim 6, wherein using a first plurality of programming pulses further comprises applying a verify pulse after each programming pulse of the first plurality of programming pulses.

8. A method of programming a memory, comprising:
   raising a threshold voltage of each of a plurality of selected cells of the memory from an initial threshold voltage to an intermediate threshold voltage for the cell of the plurality of selected cells using a first plurality of programming pulses; and
   raising the threshold voltage of each of the selected cells of the memory from its respective intermediate threshold voltage to a final threshold voltage for the respective cell using a second plurality of programming pulses;
   wherein raising a threshold voltage of each of the plurality of selected cells of the memory from the initial threshold voltage to the intermediate threshold voltage further comprises programming all levels of all selected cells as a part of one programming operation.

9. A method of programming a memory, comprising:
raising a threshold voltage of each of a plurality of selected cells of the memory from an initial threshold voltage to an intermediate threshold voltage for the cell of the plurality of selected cells using a first plurality of programming pulses; and
raising the threshold voltage of each of the selected cells of the memory from its respective intermediate threshold voltage to a final threshold voltage for the respective cell using a second plurality of programming pulses;
wherein raising a threshold voltage of each of the plurality of selected cells of the memory from the intermediate threshold voltage to the final threshold voltage further comprises programming all levels of all selected cells as a part of one programming operation.

10. The method of claim 1, and further comprising:
controlling a pulse width for the first plurality of programming pulses.

11. A method of programming a memory, comprising:
applying a first plurality of programming pulses, each programming pulse followed by a verify pulse, to selected cells of the memory to raise the threshold voltage of the selected cells to approximately an initial threshold voltage, starting at a first programming pulse voltage and incremented over the plurality of programming pulses to a first programming stop voltage; and
applying a second plurality of programming pulses, each programming pulse followed by a verify pulse, to selected cells of the memory to raise the threshold voltage of the selected cells from the initial threshold voltage to approximately a final threshold voltage, starting at a second programming pulse voltage and incremented over the plurality of programming pulses to a second programming stop voltage.

12. The method of claim 11, wherein the first programming pulse voltage and the second programming pulse voltage are equal.

13. The method of claim 11, wherein the first programming stop voltage and the second programming stop voltage are equal.

14. The method of claim 11, wherein the increment of the first plurality of programming pulses is larger than the increment of the second plurality of programming pulses.

15. The method of claim 11, and further comprising:
controlling a pulse width for the first plurality of pulses.

16. A method of programming a memory, comprising:
programming selected cells of the memory by applying a first plurality of pulses to raise the threshold voltage of the selected cells to approximately an initial threshold voltage, each of the plurality of pulses followed by a verify pulse; and
programming the selected cells from the initial threshold voltage to a final threshold voltage by applying a second plurality of pulses, each of the second plurality of pulses followed by a verify pulse.

17. The method of claim 16, wherein programming selected cells using a first plurality of pulses further comprises applying the first plurality of pulses starting at a first start voltage and ending at a first stop voltage, the pulses separated by at least one first program voltage step.

18. The method of claim 16, wherein programming selected cells from the initial threshold voltage to the final threshold voltage further comprises applying the second plurality of pulses starting at a second start voltage and ending at a second stop voltage, the pulses separated by at least one second program voltage step.

19. The method of claim 16, wherein programming selected cells using a first plurality of pulses further comprises applying the first plurality of pulses starting at a first start voltage and ending at a first stop voltage, the pulses separated by at least one first program voltage step; and
wherein programming selected cells to the final threshold voltage further comprises applying the second plurality of pulses starting at a second start voltage and ending at a second stop voltage, the pulses separated by at least one second program voltage step.

20. The method of claim 19, wherein the first program voltage step and the second program voltage step are substantially equal.

21. The method of claim 19, wherein the first program voltage step is larger than the second program voltage step.

22. The method of claim 19, wherein the first start voltage is substantially equal to the second start voltage.

23. The method of claim 19, wherein the second stop voltage is lower than the first stop voltage.

24. A method of programming a memory, comprising:
programming selected cells to approximately an initial threshold voltage with a first series of pulses, the pulses of the first series of pulses separated by at least one first program voltage step; and
programming the selected cells from approximately the initial threshold voltage to a final threshold voltage with a second series of pulses, the pulses of the second series of pulses separated by at least one second program voltage step, wherein the first program voltage step is larger than the second program voltage step.

25. The method of claim 24, further comprising inhibiting cells of the selected cells from further programming by the first series of pulses after their intermediate threshold voltage is reached.

26. The method of claim 24, further comprising applying a verify pulse after each pulse of the second series of pulses.

* * * * *